United States Patent
Drizlikh et al.

(10) Patent No.: US 7,915,093 B1
(45) Date of Patent: Mar. 29, 2011

(54) SYSTEM AND METHOD FOR MANUFACTURING AN INTEGRATED CIRCUIT ANTI-FUSE IN CONJUNCTION WITH A TUNGSTEN PLUG PROCESS

(75) Inventors: Sergei Drizlikh, Scarborough, ME (US); Ashish Kushwaha, South Portland, ME (US); Thomas James Moutinho, Gorham, ME (US); David Tucker, Falmouth, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 585 days.

(21) Appl. No.: 11/585,608

(22) Filed: Oct. 24, 2006

(51) Int. Cl.
*H01L 21/82* (2006.01)

(52) U.S. Cl. .. 438/131; 438/467; 438/600; 257/E21.209

(58) Field of Classification Search .......... 438/131–132, 438/467, 600–601, 215, 281, 333; 257/E23.147, 257/21.209
See application file for complete search history.

(56) References Cited

U.S. PATENT DOCUMENTS

| 6,440,781 | B1 | 8/2002 | Coppock et al. | |
|---|---|---|---|---|
| 6,563,189 | B1 | 5/2003 | Dark et al. | |
| 6,815,797 | B1 | 11/2004 | Dark et al. | |
| 2003/0062594 | A1* | 4/2003 | Chen | 257/530 |
| 2005/0133882 | A1* | 6/2005 | Young | 257/529 |

* cited by examiner

*Primary Examiner* — Evan Pert
*Assistant Examiner* — Matthew Reames

(57) ABSTRACT

A system and method are disclosed for manufacturing an integrated circuit anti-fuse in conjunction with a tungsten plug process. A tungsten plug is formed in a dielectric layer that overlies a portion of P type silicon and an adjacent portion of N type silicon. The dielectric layer is etched to create a first anti-fuse contact opening down to the underlying P type silicon and a second anti-fuse contact opening down to the underlying N type silicon. A metal layer is deposited over the tungsten plug and over the dielectric layer and etched to form an anti-fuse metal contact in each of two anti-fuse contact openings. A bias voltage is applied to the anti-fuse metal contacts to activate the anti-fuse.

20 Claims, 3 Drawing Sheets

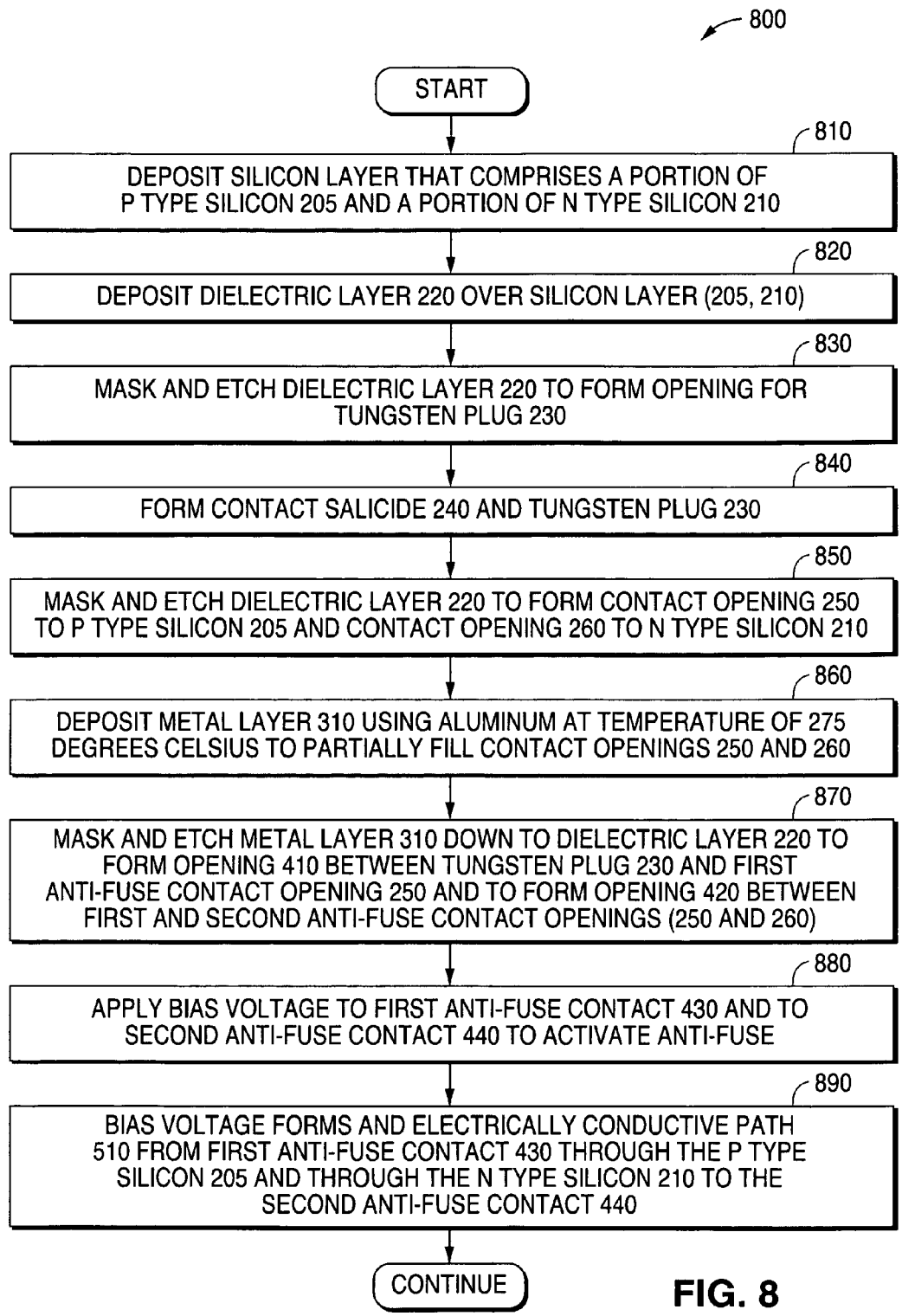

US 7,915,093 B1

SYSTEM AND METHOD FOR MANUFACTURING AN INTEGRATED CIRCUIT ANTI-FUSE IN CONJUNCTION WITH A TUNGSTEN PLUG PROCESS

TECHNICAL FIELD OF THE INVENTION

The present invention is generally directed to the manufacture of integrated circuits and, in particular, to a system and method for manufacturing an integrated circuit anti-fuse in conjunction with a tungsten plug process.

BACKGROUND OF THE INVENTION

In the manufacture of integrated circuits it is sometimes desirable to create an anti-fuse structure. The operation of an anti-fuse is opposite to the operation of a fuse. When a fuse is operationally activated, the resistance of the fuse decreases from a high level of resistance to a low level of resistance. When an anti-fuse is operationally activated, the resistance of the anti-fuse increases from a low level of resistance to a high level of resistance.

Examples of prior art anti-fuse structures and methods of their manufacture are described in U.S. Pat. No. 6,440,781 and in U.S. Pat. No. 6,563,189. These patents describe prior art anti-fuse structures that are used in conjunction with a tungsten plug metallization process. These patents describe prior art methods that employ a tungsten etchback process and a high temperature aluminum deposition to enable a good contact fill. The anti-fuse manufacturing processes that are described in the prior art are compatible with a back end process flow that uses a tungsten plug metallization process.

Further progress of integrated circuit technology has made it clear that prior art anti-fuses and the methods of their manufacture are not convenient for use in advanced aluminum backend technology nodes. Specifically, the prior art structures and methods are not convenient for use with advanced aluminum backend technology nodes of 0.35 micron size or 0.25 micron size. This makes it difficult to port an integrated circuit device design from an older factory (that uses the prior art technology) to a newer factory (that uses advanced aluminum backend technology nodes). Use of the prior art structures and methods in a newer factory would require a radical redesign of the integrated circuit device or the use of outdated process equipment in the newer factory.

Therefore, there is a need in the art for an improved anti-fuse structure and method of manufacture. There is a need in the art for an improved anti-fuse structure and method of manufacture that allows the porting of an integrated circuit device design from an older technology. There is a need in the art for an improved anti-fuse structure and method of manufacture that is compatible with advanced aluminum backend technology nodes. There is a need in the art for an improved anti-fuse structure and method of manufacture that can remedy the above described deficiencies of prior art anti-fuse technology.

In an advantageous embodiment of the system and method of the present invention, a tungsten plug is formed in a dielectric layer, that overlies a portion of P type silicon and an adjacent portion of N type silicon. The dielectric layer is etched to create a first anti-fuse contact opening down to the underlying P type silicon and a second anti-fuse contact opening down to the underlying N type silicon. A metal layer is then deposited over the tungsten plug and over the dielectric layer. The metal layer is then etched to form a first anti-fuse metal contact in the first anti-fuse contact opening and to form a second anti-fuse metal contact in the second anti-fuse contact opening.

A bias voltage is applied to the first and second anti-fuse metal contacts to activate the anti-fuse. The application of the bias voltage creates an electrically conductive path from the first anti-fuse metal contact through the underlying P type silicon and through the underlying N type silicon to the second anti-fuse metal contact.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIG. 8 illustrates a flow chart showing steps of method for manufacturing an anti-fuse of the present invention.

DETAILED DESCRIPTION OF THE INVENTION

FIGS. 1 through 8, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged integrated circuit.

Figure 1:
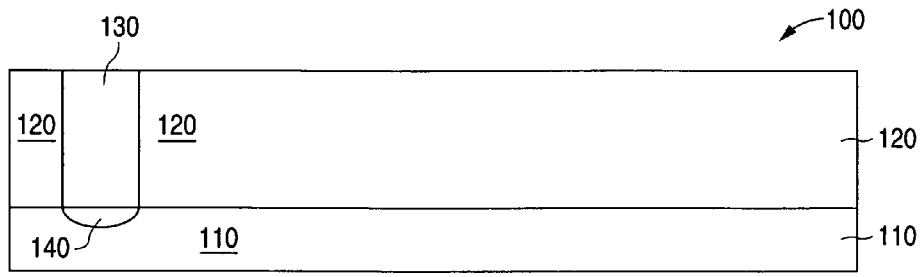
FIG. 1 illustrates a prior art integrated circuit structure that comprises a dielectric layer over a silicon layer and a tungsten plug through the dielectric layer where the tungsten plug extends down to the underlying silicon layer.

FIG. 1 illustrates of a prior art integrated circuit structure 100. Structure 100 comprises a silicon layer 110 and a dielectric layer 120 over the silicon layer 110. Conventional means are used to etch an opening through the dielectric layer 120 and fill the opening with a tungsten plug 130. A contact salicide 140 is first formed at the bottom of the plug opening and then the plug opening is filled with tungsten to form the tungsten plug 130. The tungsten plug 130 provides a conductive electrical path through the dielectric layer 120 to the underlying silicon layer 110.

Figure 2:
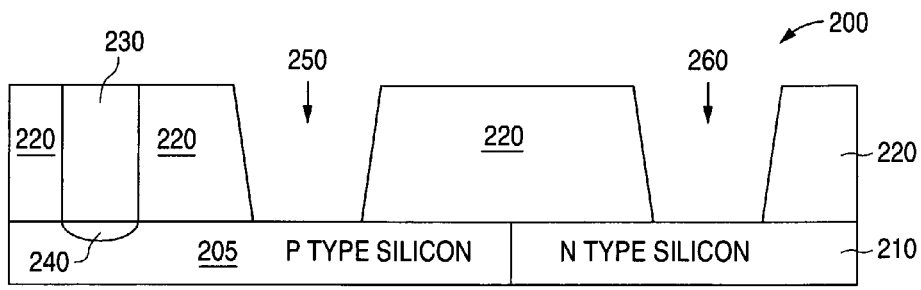
FIGS. 2 through 4 illustrate cross sectional views showing sequential steps in the manufacture of an anti-fuse of the present invention.
Figure 3:
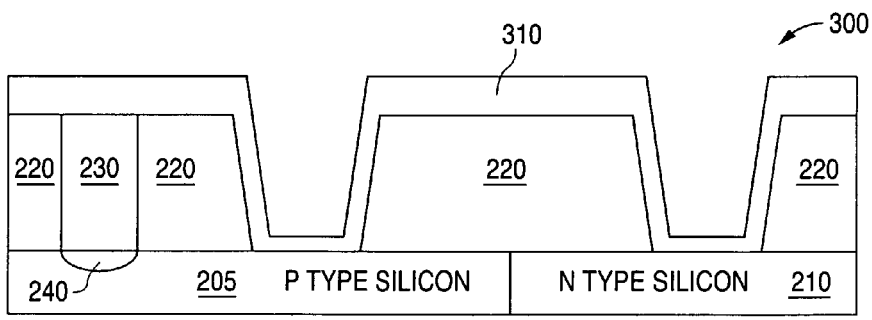
Figure 4:
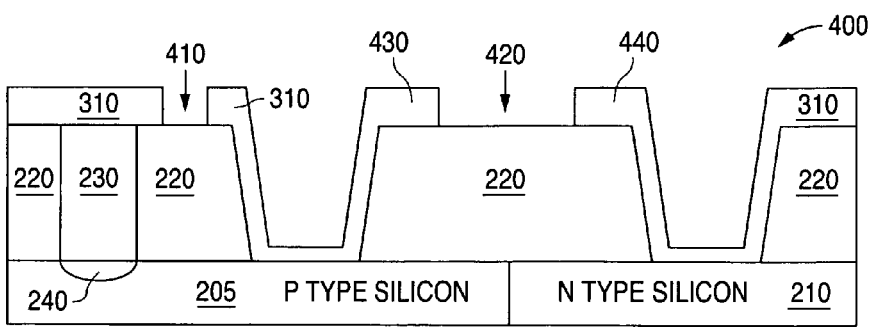

FIGS. 2 through 4 illustrate cross sectional views showing sequential steps in the manufacture of an anti-fuse of the present invention. FIG. 2 illustrates a cross sectional view of an integrated circuit structure 200 that comprises an underlying silicon layer. The underlying silicon layer comprises a portion of P type silicon 205 and an adjacent portion of N type silicon 210. The portion of P type silicon 205 and the portion of N type silicon 210 are covered with a dielectric layer 220. Conventional means are used to etch an opening through the dielectric layer 220 and fill the opening with a tungsten plug 230. A contact salicide 240 is first formed at the bottom of the plug opening and then the plug opening is filled with tungsten to form the tungsten plug 230. The tungsten plug 230 provides a conductive electrical path through the dielectric layer 220 to the portion of P type silicon 205.

Then a second mask and etch procedure is used to etch contact openings 250 and 260 through the dielectric layer 220 in order to form the anti-fuse contacts of the present invention. Contact opening 250 extends through the dielectric layer 220 down to the underlying portion of P type silicon 205. Contact opening 260 extends through the dielectric layer 220 down to the underlying portion of N type silicon 210.

After a contact etch and clean procedure has been performed to form the contact openings 250 and 260, a metal deposition procedure is applied to cover the surface of structure 200 with a metal layer 310. The metal layer 310 is shown in FIG. 3. Aluminum is a metal that is typically used for the metal layer 310. The metal deposition procedure is applied at this point in the manufacturing method skipping a step of liner processing that is usually applied at this point. No liner or salicidation steps are performed during the formation of the anti-fuse contacts.

FIG. 3 illustrates a cross sectional view of an integrated circuit structure 300 of the present invention. The metal layer 310 covers the top of the tungsten plug 230 and the surface of the dielectric layer 220. The metal layer 310 also covers the sides and bottoms of the contact openings 250 and 260.

In the next step of the method of the present invention a mask and etch procedure is performed to etch two openings (410 and 420) through metal layer 310. FIG. 4 illustrates a cross sectional view that shows an integrated circuit structure 400 of the present invention after the metal layer 310 has been etched. As shown in FIG. 4, opening 410 through the metal layer 310 is located between the tungsten plug 230 and the metal covered contact opening 250 that extends down to the P type silicon 205. Opening 410 extends through the metal layer 310 down to the top of the dielectric layer 220.

Opening 420 through the metal layer 310 is located between the metal covered contact opening 250 that extends down to the P type silicon 205 and the metal covered contact opening 260 that extends down to the N type silicon 210. Opening 420 extends through the metal layer 310 down to the top of the dielectric layer 220. As shown in FIG. 4, the location of opening 420 is over the junction between the P type silicon 205 and the N type silicon 210.

The integrated circuit structure 400 forms the anti-fuse the present invention. The metal covered contact opening 250 that extends down to the P type silicon 205 forms a first anti-fuse contact 430. The metal covered contact opening 260 that extends down to the N type silicon 210 forms a second anti-fuse contact 440. The electrical path between first contact 430 and second contact 440 goes though the P type silicon 205 and the N type silicon 210. There is a relatively high electrical resistance at the juncture of the P type silicon 205 and the N type silicon 210.

When it is desired to maintain the relatively high electrical resistance of the anti-fuse, then the anti-fuse is left electrically open. Then other process steps that reduce contact resistance in other areas (not shown) of the integrated circuit device (such as contact salicidation and argon plasma sputter etch clean) are not needed for the anti-fuse.

When it is desired to reduce the relatively high electrical resistance of the anti-fuse, then the anti-fuse is made operational by applying a bias voltage between the first anti-fuse contact 430 and the second anti-fuse contact 440. A typical bias voltage may have a value of fourteen volts (14 V) to twenty two volts (22 V). Application of a bias voltage to the anti-fuse contacts (430 and 440) is sometimes referred to as "zapping" the anti-fuse.

Figure 5:
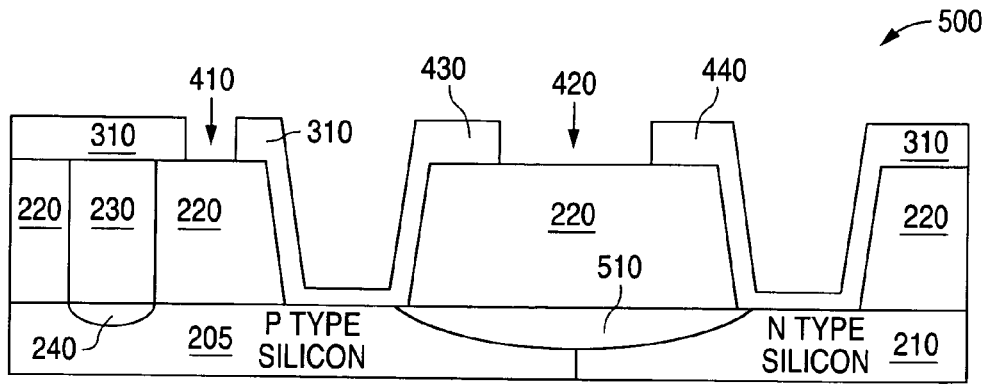
FIG. 5 illustrates a cross sectional view that shows an anti-fuse of the present invention as shown in FIG. 4 after the anti-fuse has been operationally activated.

Application of the bias voltage will form an electrically conductive path from the first anti-fuse contact 430, and through the P type silicon 205, and through the N type silicon 210 to the second anti-fuse contact 440. The portion of the electrically conductive path through the P type silicon 205 and the N type silicon 210 is shown in FIG. 5 and designated with reference numeral 510. FIG. 5 illustrates a cross sectional view that shows an integrated circuit structure 500 of the present invention after the portion 510 of the electrically conductive path has been formed by applying a bias voltage.

The portion 510 of the electrically conductive path is formed by a melted mix of metal and silicon. When the metal is aluminum, then the portion 510 of the electrically conductive path is formed by a melted mix of aluminum and silicon. The portion 510 of the electrically conductive path occurs due to a thermal-electric breakdown of the P type silicon 205 and the N type silicon 210 that is induced by the application of the bias voltage. The portion 510 of the electrically conductive path creates an electrical short between the first anti-fuse contact 430 and the second anti-fuse contact 440.

When aluminum is used as the metal to fill a contact opening it is industry practice to use a deposition temperature of at least four hundred fifty degrees Celsius (450° C.). This relatively high temperature is used to ensure that the aluminum material fully fills the contact opening.

In the anti-fuse contact openings (250, 260) of the present invention it has been discovered that such a high temperature is not required. It has been discovered that a relatively low deposition temperature of approximately two hundred seventy five degrees Celsius (275° C.) may be successfully used for the aluminum deposition in the anti-fuse contact openings (250, 260) of the present invention. As shown in FIGS. 3 through 5, the aluminum deposition for the anti-fuse contacts of the present invention need only partially fill the contact openings (250, 260). The expression "partially fill" refers to covering the sides and bottoms of the anti-fuse contact openings (250, 260) with aluminum material. The aluminum material need not fully fill the contact openings (250, 260). Therefore, the lower temperature of approximately 275° C. may be successfully used.

The system and method of the present invention can also be used to form an anti-fuse structure in an integrated circuit structure that uses a LOCOS isolation process. The letters "LOCOS" stand for Local Oxidation of Silicon. LOCOS is a well known isolation technique used in older technologies to create an isolation between elements of an integrated circuit (e.g., transistors).

Figure 6:
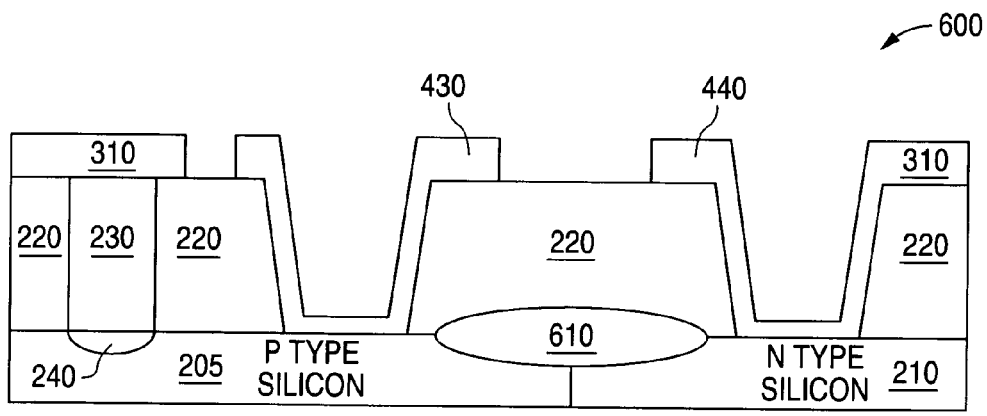
FIG. 6 illustrates a cross sectional view that shows an anti-fuse of the present invention formed under a Local Oxidation of Silicon (LOCOS) isolation structure.

FIG. 6 illustrates a cross sectional view that shows an integrated circuit structure 600 of the present invention showing an anti-fuse of the present invention formed under a Local Oxidation of Silicon (LOCOS) isolation structure 610. The integrated circuit structure 600 shown in FIG. 6 is the same as the integrated circuit structure 400 shown in FIG. 4 except that it comprises LOCOS structure 610. LOCOS structure 610 is located between the silicon layer (comprising portions 205 and 210) and the dielectric layer 220. LOCOS structure 610 is located above the juncture of the P type silicon 205 and the N type silicon 210.

Figure 7:
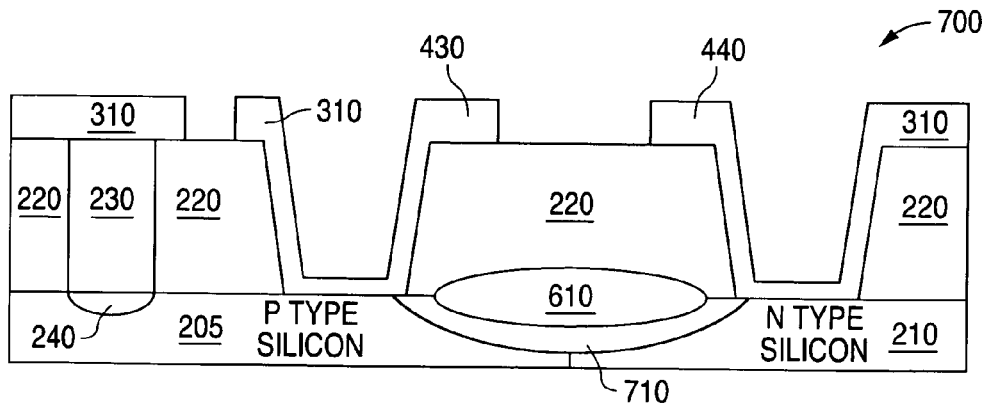
FIG. 7 illustrates a cross sectional view that shows an anti-fuse of the present invention as shown in FIG. 6 after the anti-fuse has been operationally activated.

The anti-fuse of structure 600 is made operational by applying a bias voltage between the first anti-fuse contact 430 and the second anti-fuse contact 440. Application of the bias voltage will form an electrically conductive path from the first anti-fuse contact 430, and through the P type silicon 205 under LOCOS structure 610, and through the N type silicon 210 under LOCOS structure 610 to the second anti-fuse contact 440. The portion of the electrically conductive path through the P type silicon 205 and the N type silicon 210 is shown in FIG. 7 and designated with reference numeral 710. FIG. 7 illustrates a cross sectional view that shows an integrated circuit structure 700 of the present invention after the portion 710 of the electrically conductive path has been formed by applying a bias voltage.

FIG. 8 illustrates a flow chart 800 showing steps of method for manufacturing an anti-fuse of the present invention. In the first step of the method a silicon layer is deposited that comprises a portion of P type silicon 205 and an adjacent portion of N type silicon 210 (step 810). Then a dielectric layer 220 is deposited over the silicon layer (205,210) (step 820).

Then a mask and etch procedure is performed to etch an opening through the dielectric layer 220 to receive a tungsten plug 230 (step 830). Then a contact salicide 240 is formed at the bottom of the tungsten plug opening and the opening is filled with the tungsten plug 230 (step 840).

Then a mask and etch procedure is performed to etch a first anti-fuse contact opening 250 through dielectric layer 220 down to the P type silicon 205 and to etch a second anti-fuse contact opening 260 through dielectric layer 220 to the N type silicon 210 (step 850). Then a metal layer 310 is deposited. Aluminum 310 may be deposited at a relatively low temperature of two hundred seventy five degrees Celsius (275° C.) to partially fill the first anti-fuse contact opening 250 and to partially fill the second anti-fuse contact opening 260 (step 860).

Then a mask and etch procedure is performed to etch the metal layer 310 down to the dielectric layer 220 to form an opening 410 between the tungsten plug 230 and the first anti-fuse contact opening 250 and to form an opening 420 between the first and second anti-fuse contact openings (250 and 260) (step 870).

To active the anti-fuse a bias voltage is applied to the first anti-fuse contact 430 of the metal 310 of the first anti-fuse contact opening 250 and to the second anti-fuse contact 440 of the metal 310 of the second anti-fuse contact opening 260 (step 880). The bias voltage forms an electrically conductive path 510 from the first anti-fuse contact 430 through the P type silicon 205 and through the N type silicon 210 and to the second anti-fuse contact 440 (step 890).

The method of the present invention for manufacturing an anti-fuse in an integrated circuit is compatible with back end flow processes that are used in 0.35 micron technology and in 0.25 micron technology. The method of the present invention for manufacturing an anti-fuse in an integrated circuit is also compatible with advanced aluminum metallization processes.

The method of the present invention uses a mask and etch procedure to create a tungsten plug in a dielectric layer that overlies a portion of P type silicon and a portion of N type silicon. The method then uses a mask and etch procedure to create a first anti-fuse contact opening through the dielectric layer to the underlying P type silicon and a second anti-fuse contact opening through the dielectric layer to the underlying N type silicon. The mask and etch procedure that creates the first and second anti-fuse contact openings does not require the use of salicidation and liner formation that are used in prior art methods.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A method of manufacturing an anti-fuse in an integrated circuit, the method comprising the steps of:
    forming a silicon layer that comprises a portion of P type silicon and an adjacent portion of N type silicon in physical contact with the portion of P type silicon;
    forming a dielectric layer over the silicon layer;
    etching a first contact opening through the dielectric layer down to the portion of P type silicon;
    etching a second contact opening through the dielectric layer down to the portion of N type silicon; and
    depositing a layer of aluminum material at a temperature of approximately two hundred seventy five degrees Celsius (275° C.) over the etched dielectric layer and over the portion of P type silicon that is accessible through the first contact opening and over the portion of N type silicon that is accessible though the second contact opening.

2. The method as claimed in claim 1, further comprising the step of:
    forming a tungsten plug in an opening in the dielectric layer.

3. The method as claimed in claim 2, further comprising the step of:
    forming a contact salicide at a bottom of the opening in the dielectric layer before forming the tungsten plug.

4. The method as claimed in claim 1, wherein the step of depositing the layer of aluminum material comprises:
    partially filling the first contact opening with aluminum material; and
    partially filling the second contact opening with aluminum material.

5. The method as claimed in claim 1, further comprising the step of:
    performing a mask and etch procedure to etch portions of the layer of aluminum material down to the dielectric layer to form a first anti-fuse contact in electrical contact with the portion of P type silicon and to form a second anti-fuse contact in electrical contact with the portion of N type silicon.

6. The method as claimed in claim 5, further comprising the step of:
  applying a bias voltage across the first anti-fuse contact and the second anti-fuse contact to activate the anti-fuse.

7. The method as claimed in claim 6, further comprising the step of:
  using the bias voltage to form an electrically conductive path from the first anti-fuse contact through the portion of P type silicon and through the portion of N type silicon to the second anti-fuse contact.

8. The method as claimed in claim 7, wherein the electrically conductive path through the portion of P type silicon and through the portion of N type silicon passes under a LOCOS isolation structure associated with the portion of P type silicon and the portion of N type silicon.

9. A method of manufacturing an anti-fuse in an integrated circuit in conjunction with a tungsten plug process, the method comprising the steps of:
  forming a silicon layer that comprises a portion of P type silicon and an adjacent portion of N type silicon in physical contact with the portion of P type silicon;
  forming a dielectric layer over the silicon layer;
  etching a tungsten plug opening through the dielectric layer down to the portion of P type silicon;
  forming a tungsten plug in the tungsten plug opening that is in electrical contact with the portion of P type silicon;
  etching a first contact opening through the dielectric layer down to the portion of P type silicon;
  etching a second contact opening through the dielectric layer down to the portion of N type silicon; and
  depositing a layer of aluminum material at a temperature of approximately two hundred seventy five degrees Celsius (275° C.) over the etched dielectric layer, over the tungsten plug, over the portion of P type silicon that is accessible through the first contact opening, and over the portion of N type silicon that is accessible though the second contact opening.

10. The method as claimed in claim 9, further comprising the step of:
  forming a contact salicide at a bottom of the tungsten plug opening before forming the tungsten plug.

11. The method as claimed in claim 9, further comprising the step of:
  performing a mask and etch procedure to etch portions of the layer of aluminum material down to the dielectric layer to form a first anti-fuse contact in electrical contact with the portion of P type silicon and to form a second anti-fuse contact in electrical contact with the portion of N type silicon.

12. The method as claimed in claim 9, wherein the step of depositing the layer of aluminum material comprises:
  partially filling the first contact opening with aluminum material; and
  partially filling the second contact opening with aluminum material.

13. The method as claimed in claim 11, wherein one of the etched portions of the aluminum material layer is located over a junction between the P type silicon and the N type silicon.

14. The method as claimed in claim 11, further comprising the step of:
  applying a bias voltage across the first anti-fuse contact and the second anti-fuse contact to activate the anti-fuse.

15. The method as claimed in claim 14, further comprising the step of:
  using the bias voltage to form an electrically conductive path from the first anti-fuse contact through the portion of P type silicon and through the portion of N type silicon to the second anti-fuse contact.

16. The method as claimed in claim 15, wherein the electrically conductive path through the portion of P type silicon and through the portion of N type silicon passes under a LOCOS isolation structure associated with the portion of P type silicon and the portion of N type silicon.

17. The method of claim 5, wherein the first anti-fuse contact and the second anti-fuse contact are separated by an opening in the layer of aluminum material, the opening positioned over a contact area where the portion of P type silicon contacts the portion of N type silicon.

18. The method of claim 6, wherein applying the bias voltage across the first and second anti-fuse contacts creates an electrically conductive path through the portion of P type silicon and the portion of N type silicon, the electrically conductive path comprising a melted mixture of metal from the layer of aluminum material and silicon from the silicon layer.

19. A method comprising:
  forming a silicon layer comprising a portion of P type silicon and an adjacent portion of N type silicon in physical contact with the portion of P type silicon;
  forming a dielectric layer over the silicon layer;
  etching a first contact opening through the dielectric layer down to the portion of P type silicon;
  etching a second contact opening through the dielectric layer down to the portion of N type silicon;
  depositing a layer of aluminum material at a temperature of approximately two hundred seventy five degrees Celsius (275° C.) over the etched dielectric layer, over the portion of P type silicon that is accessible through the first contact opening, and over the portion of N type silicon that is accessible though the second contact opening, the layer of aluminum material partially filling the first contact opening and the second contact opening; and
  etching portions of the layer of aluminum material down to the dielectric layer to form a first anti-fuse contact in electrical contact with the portion of P type silicon and to form a second anti-fuse contact in electrical contact with the portion of N type silicon.

20. The method of claim 19, further comprising:
  applying a bias voltage across the first anti-fuse contact and the second anti-fuse contact;
  wherein applying the bias voltage creates an electrically conductive path through the portion of P type silicon and the portion of N type silicon, the electrically conductive path comprising a melted mixture of metal from the layer of aluminum material and silicon from the silicon layer.

* * * * *